June 13, 1967 S. A. FOTTLER ET AL 3,325,258

MULTILAYER RESISTORS FOR HYBRID INTEGRATED CIRCUITS

Filed Nov. 27, 1963

J. P. Keene
S. A. Fottler
INVENTOR

BY John G. Graham
ATTORNEY 3,325,258
Patented June 13, 1967

3,325,258
MULTILAYER RESISTORS FOR HYBRID INTEGRATED CIRCUITS

Stanley A. Fottler, Millington, N.J., and Joe P. Keene, Richardson, Tex., assignors to Texas Instruments Incorporated, Dallas, Tex., a corporation of Delaware Filed Nov. 27, 1963, Ser. No. 326,621
2 Claims. (Cl. 29—183.5)

This invention relates to thin film resistors, and more particularly to deposited bi-metal film resistors which are suitable for use in integrated electronic circuits.

Semiconductor integrated circuits ordinarily include a single wafer of monocrystalline silicon which has all of the circuit elements formed in the silicon. The transistors, diodes, capacitors and resistors are all provided by selective diffusions into one face of the wafer. For some circuits, however, it is necessary to have resistors of fairly large values, and with high precision or low temperature coefficient of resistance, but these qualities are difficult to obtain in diffused semiconductor resistors. In order to provide resistors with the desired properties, and still have the size advantage provided by the integrated circuit approach, resistors are sometimes produced by depositing strips of resistive material on top of a silicon wafer over an insulting coating. The transistors and other elements are formed within the wafer as before. These devices are referred to as hybrid integrated circuits since a combination of thin film and semiconductor integrated circuit techniques are used. The basic concept of hybrid integrated circuits is set forth in the copending application S.N. 811,486, filed May 6, 1959 and now patent No. 3,138,744, by Jack S. Kilby, assigned to the assignee of the present invention.

Materials useful for thin film resistors on silicon circuit wafers must exhibit properties of high resistance in ohms per square, low temperature coefficient of resistance, and compatibility of fabrication techniques compared with the other manufacturing steps of the device. Various metals and metal oxides have been proposed for use as resistors in integrated circuits, but prior to this invention all known compatible materials exhibited a temperature coefficient of resistance which was unacceptable for most applications, deterioration with aging, or other undesirable properties.

It is, therefore, the principal object of this invention to provide thin film resistors having a low temperature coefficient of resistance. Another object is to provide improved resistors for integrated circuits. A further object is to provide thin film resistors made by a process which is compatible with the fabrication techniques used in the manufacture of integrated circuits.

In accordance with this invention, thin films of refractory metals deposited on top of an insulating substrate are used as resistors. In particular, a molybdenum film deposited over silicon oxide or glass provides a resistance material, and in order to prevent reaction of the molybdenum, a thin film of tantalum is applied on top of the Mo. It has been found that the temperature coefficient of resistance of the bi-metal film is quite low compared to the coefficients of the two metals above. If the thickness of the tantalum coating relative to the molybdenum film is maintained at a ratio of about 1 to 9, the temperature coefficient of the combination will be virtually zero. The resistance value of this multilayer thin film resistor may be varied over a wide useful range.

The novel features believed to be characteristic of this invention are set forth in the appended claims. The invention will best be understood, however, by reference to the following detailed description, when read in conjunction with the accompanying drawing, wherein:

Figures 1, 2, 3, 4, 5, 6:
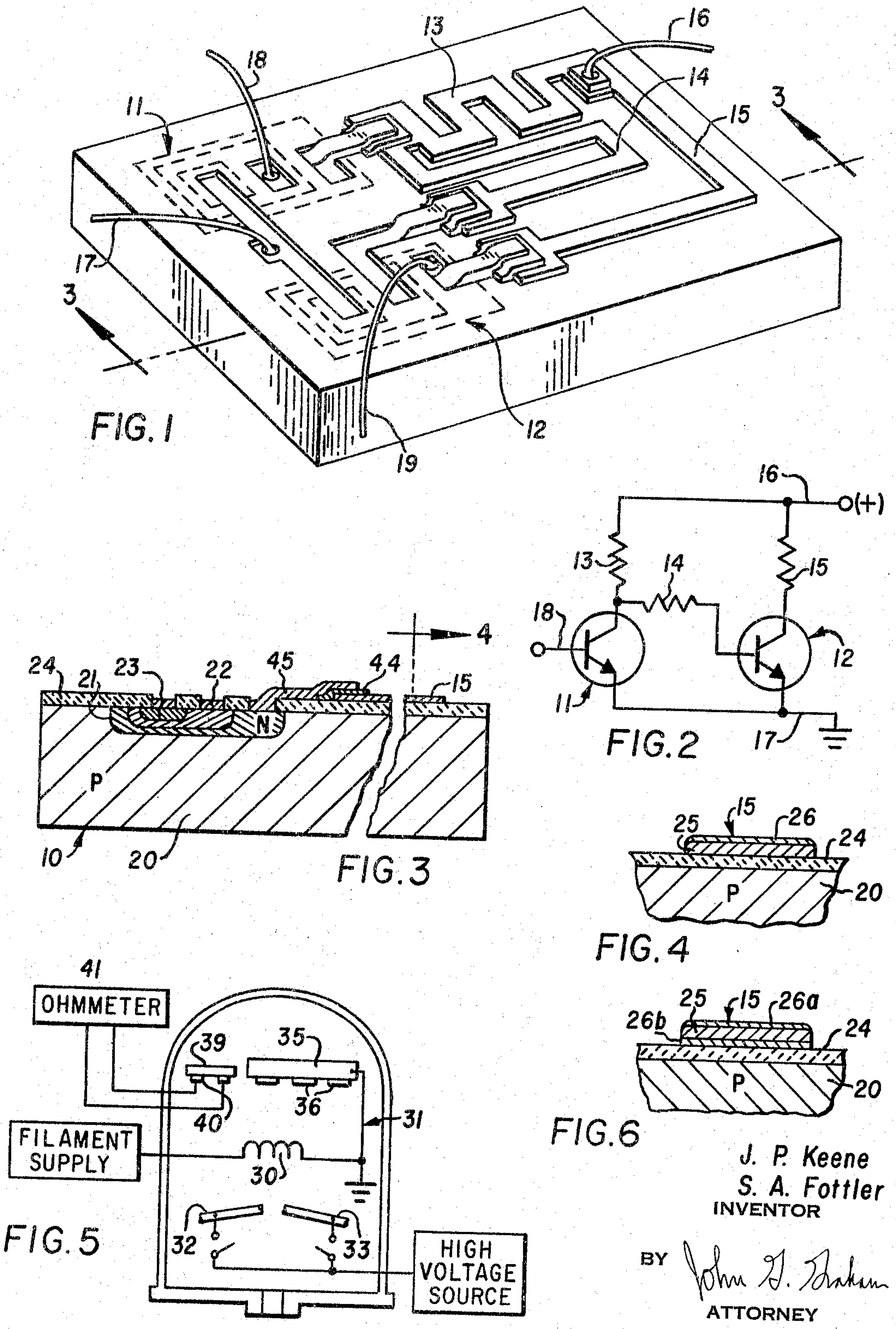
FIGURE 1 is a pictorial view of a hybrid integrated circuit of a type which may employ the resistors of this invention.
FIGURE 2 is a schematic diagram of the electronic circuit incorporated into the integrated circuit wafer of FIGURE 1.
FIGURE 3 is a sectional view of the wafer of FIGURE 1 taken along the lines 3—3.
FIGURE 4 is a greatly enlarged sectional view of one of the resistors of FIGURE 1.
FIGURE 5 is a schematic representation of deposition apparatus employed in making the resistors of this invention.
FIGURE 6 is a greatly enlarged cross-sectional view of another embodiment of the resistors of this invention.

The particular substrate used as a base for the thin film resistors is not critical, nor is the type of circuit in which the resistors are used. However, these resistors have perhaps greatest utility at present in hybrid integrated circuits, which are at this time made in planar geometry using monolithic silicon wafers with silicon oxide used as a diffusion mask and left on to protect the surface. With this in mind, a typical circuit in which these resistors will be used will now be described by way of background.

With reference to FIGURE 1, an intergrated circuit wafer 10 is shown which is composed of monocrystalline silicon and has formed therein a pair of transistors 11 and 12. Three thin film resistors 13, 14 and 15 are provided on the wafer, contacts are made to the ends of the resistors, and interconnections are made between the various contacts by conductive strips to form the amplifier circuit of FIGURE 2. In operation of the circuit, a voltage source is connected to a supply input 16, and a ground connection 17 to the emitters of both transistors is provided. A signal applied to an input 18, which is connected to the base of the transistor 11, will appear amplified at an output 19 connected to the collector of the second transistor 12. Of course, this circuit is merely illustrative of one environment in which the resistors of this invention may be utilized.

As may be seen in FIGURE 3, the wafer 10 would include a region 20 of P-type silicon comprising the major bulk of the unit and providing, in effect, a substrate. The transistors 11 and 12 are formed simultaneously by successive diffusions of donor and acceptor impurities to produce an N-type region collector region 21, a P-type base region 22, and an N-type emitter region 23. These diffusions are ordinarily done with silicon oxide as a mask, with the oxide being left on the wafer to passivate the junctions. Of course, diffused resistors, diodes and capacitors can be formed in the wafer at the same time that the transistors are being formed as is well known in the art. After the last diffusion operation, the oxide is removed from selected areas of the wafer where contacts are to be made, such as over the collector, base and emitter regions of the transistors. Conductive material is deposited upon the wafer to form these contacts in the selected areas. The oxide remains intact over the major portion of the wafer surface, however, as an insulating layer 24. On top of this insulating layer, the thin film resistors including the resistor 15 are formed in the manner described below.

A greatly enlarged cross-sectional view of the resistor 15 is seen in FIGURE 4. This resistor includes a thin layer 25 of molybdenum overlying the silicon oxide coating 24, and a thinner layer 26 of tantalum overlies the molybdenum. The tantalum provides two necessary features of the invention. One function is to prevent reaction of the Mo with oxygen, and the other is, in combination with the Mo, to produce a very low temperature coefficient of resistance. It has been established that some metals, when in the form of thin films, will have a temperature coefficient of resistance which may be positive in relatively thick films then switch to negative for a thinner configuration. Molybdenum exhibits this characteristic. If the thickness of the Mo layer 25 is about 900 A., for example, then the tantalum film 26 should be about 100 A., maintaining a ratio of about 9 to 1. With this structure, the negative temperature coefficient of resistance of the Mo will be roughly matched with a positive temperature coefficient for the Ta, producing a net coefficient approaching zero. While an actual value of zero might be difficult to produce, resistors are easily fabricated with temperature coefficients of resistance less than about 55 p.p.m./°C. (parts per million per degree centigrade).

The thicknesses of the films 25 and 26 is not extremely critical, but may vary over a considerable range. However, it is quite important to maintain the ratio of thicknesses at about the value of 9 to 1 if the temperature coefficient is to below. To obtain 1% precision resistors, the deviation from this 9 to 1 value should not be more than perhaps 10%. The lower limit for the thickness of the Mo-Ta films is determined primarily by the difficulty in working with films less than a few hundred Angstrom units thick, and by the fact that resistance values of sufficient magnitude for most applications will be obtained with films of perhaps 50 A. Ta, 450 A. Mo. There is no specific upper limit to the thicknesses of the film, since the advantage in temperature coefficient will still be obtained even as the thickness of the Mo approaches that which will result in its exhibiting bulk resistivity rather than the thin film characteristics. This would be at perhaps 50,000 A. However, a resistor exhibiting less than about 100 ohms per square would not be of greater utility, and this value is obtained at about 1500 to 2000 A. of Mo. Thus, the most useful range of resistance values appears to be provided by films having Mo thicknesses of about 500 to 2000 A. and a Ta thickness in the region of less than 50 to about 200 A., maintaining the 9 to 1 ratio, of course.

A preferred method of making these Mo-Ta thin film resistors employs a non-focused diode electron gun. Such a mechanism is illustrated schematically in FIGURE 5. A tungsten filament 30 is suspended in an evacuated chamber 31 and heated by current flowing therethrough so that electrons are evolved. Positioned below the filament are a pair of anodes 32 and 33 composed of elemental molybdenum and elemental tantalum, respectively. Either of the anodes may be energized by a switching arrangement to apply a high positive voltage, producing the electron current which provides the deposition operation. Positioned above the filament 30 is a holder 35 with several substrates 37 secured to the lower side. These workpieces are the silicon slices or substrates with silicon oxide coatings, as mentionad above. A suitable mask may be positioned over the silicon slices to produce resistors in the desired circuitous or elongated configurations. This mask is composed of a convenient metal such as nickel, and should be as thin as possible to produce fine definition of the line edges. The deposition is controlled by a monitoring device which is positioned within the chamber. This device comprises a glass slide 39 of unit width having parallel conductors 40 spaced a unit length apart. The resistance between the conductors will be a direct reading in ohms per square, and is monitored by applying the output of a resistance measuring device 41 to a strip chart recorder. The desired resistance value can be approached gradually by observing the chart. The thickness of the deposited films, and thus the resistivity, is controlled by varying the time and/or rate of deposition. The latter is varied by a number of factors, including the current through the filament 30, the filament-to-anode voltage and current, and the spacing between the workholder 35 and the anodes.

An example of how a typical resistor would be made using the apparatus of FIGURE 5 will now be described. The workholder 35 is positioned at a distance of four inches from the anodes 32 and 33, and the chamber 31 is evacuated to a pressure of $5\times10^{-5}$ torr or less. The tungsten filament 30 is heated by passing a current of perhaps 30 amps therethrough at 5 volts, although these values would depend upon the filament used. A voltage of +2000 volts is applied to the anode 32, with the filament-to-anode current being limited to 200 milliamp, and this voltage is maintained for about 90 sec. The high voltage supply is then switched over to the tantalum rod anode 33 and maintained for about 6 min. The longer time period for Ta is due to its much slower deposition rate. The resistance measured between the contacts 40 on the monitoring slide will decrease to a value of about 1200 ohms while the Mo is being deposited, then change to 1000 ohms when the tantalum film is added. This example will produce a film of about 500 to 700 A. total thickness having a resistance of about 1000 ohm per square. The ratio of thicknesses of Mo and Ta is 9 to 1. In the integrated circuit of FIGURE 1, a strip 10 mils long and one mil wide composed of this film would provide a 10K ohm resistor. It is preferable to make only one deposition, so if resistors of several different values are needed this is provided by selecting appropriate lengths and widths for the various resistive strips. So long as the Ta-Mo thickness ratio is 1 to 9, these resistors may be temperature cycled from perhaps −50° C. to +125° C. with no measurable change in resistance.

In the above example, if the deposition of molybdenum had continued for about 2 min., with a corresponding increase for that of tantalum to 12 min., the resistance of the resulting film would be about 100 ohm per square. The total thickness of this film would be about 1500 to 2000 A. On the other hand, deposition times of 45 sec. for molybdenum and 2 min. for Ta would produce 1 meg ohm per square resistance with a film thickness which is difficult to measure but would probably be less than 200 A. These deposition times are merely illustrative and could be changed greatly by varying the rate of deposition by one of the mechanisms discussed above.

Although the thin tantalum film serves to provide a low temperature coefficient of resistance, it also prevents the upper surface of the molybdenum film from oxidizing. The Mo, if left unprotected, would immediately change to molybdenum oxide which would be useless as a resistor. Since the Ta film is deposited over the Mo without breaking the vacuum in the chamber, there is no opportunity for the Mo to oxidize on its upper surface. However, the lower surface of the Mo film is in contact with the $SiO_2$ layer on the silicon substrate, and since Mo is so highly reactive, it may oxidize to some extent on the lower surface. A more stable resistor may be obtained by placing the Ta film on both top and bottom of the Mo film. This could be done by first depositing a light film of Ta by energizing the Ta anode 33 in the apparatus of FIGURE 5, then switching over to the Mo anode 32, the back to the Ta anode. A structure as seen in FIGURE 6 would result, where Ta films **26*a* and 26*b* overlie and underlie the Mo film 25. The ratio of 9:1 for Mo and Ta must be maintained even in this sandwich structure, so each of the Ta films 26*a* and 26*b*** would be proportioned accordingly. Each of these two Ta films could be one-half as thick as before.

Once the bi-metal film resistors of FIGURES 4 or 6 have been deposited, contacts must be made to each end of each individual resistor so that the devices may be connected into a circuit. In semiconductor integrated circuits as presently manufactured, strips of aluminum film are universally employed as contacts and leads. Aluminum forms an eutectic with the Mo-Ta at about 200° C., and is therefore undesirable as a direct contact to the bi-metal resistors. Gold contact areas are thus deposited over the ends of each resistor to facilitate making interconnections. These contact areas are deposited in a conventional manner using suitable masking techniques. In FIGURE 3, it is seen that the resistor 15 has a gold contact 44 at one end, and an aluminum strip 45 extends from the gold contact to the collector contact of the transistor 12. Similar contacts and lead strips are provided for the remainder of the hybrid integrated circuit for FIGURE 1.

In some cases, it has been found advantageous to utilize a thin overcoating of glass on silicon integrated circuits. The bi-metal resistors of this invention could be deposited over the vitrous glaze as well as over the silicon oxide as described above. The primary requirements for the substrate are that it be smooth and insulating.

While this invention has been described with reference to illustrative embodiments, this description is not meant to be construed in a limiting sense. Various modifications of the disclosed embodiments, as well as other embodiments of the invention, will be apparent to persons skilled in the art. It is, therefore, contemplated that the appended claims will cover any such modifications or embodiments as fall within the true scope of the invention.

We claim:

1. A resistive element comprising an insulating substrate, a thin film of molybdenum adherent to said substrate, a relatively thinner coating of tantalum overlying said film of molybdenum, the thickness of the molybdenum being about nine times that of the tantalum, ar a pair of electrical contacts engaging spaced-apart area of said film.

2. A resistive element comprising a thin film of molyb denum adherent to an insulating substrate, the thickne of the film being in the range of from about 100 A. t about 2000 A., a coating of tantalum covering said film the thickness of the coating being about one-ninth a thick as the film.

References Cited

UNITED STATES PATENTS

| | | | |
|---|---|---|---|
| 2,994,847 | 8/1961 | Vodar | 338—30 |
| 3,138,744 | 6/1964 | Kilby | 317—10 |
| 3,256,588 | 6/1966 | Sikina et al. | 117—21 |
| 3,258,413 | 6/1966 | Pendergast | 204—19 |
| 3,258,898 | 7/1966 | Garibotti | 117—21 |

ALFRED L. LEAVITT, *Primary Examiner.*

WILLIAM L. JARVIS, *Examiner.*